(12) United States Patent
Larson et al.

(10) Patent No.: US 7,795,868 B2
(45) Date of Patent: Sep. 14, 2010

(54) HYPERPOLARIZED DYNAMIC CHEMICAL SHIFT IMAGING WITH TAILORED MULTIBAND EXCITATION PULSES

(75) Inventors: Peder E. Larson, Oakland, CA (US); John M. Pauly, Stanford, CA (US); Daniel B. Vigneron, Corte Madera, CA (US); Albert Chen, San Francisco, CA (US); Adam B. Kerr, Menlo Park, CA (US)

(73) Assignees: The Board of Trustees of the Leland Stanford Junior University, Palo Alto, CA (US); The Regents of the University of California, Oakland, CA (US)

( * ) Notice: Subject to any disclaimer, the term of this patent is extended or adjusted under 35 U.S.C. 154(b) by 0 days.

(21) Appl. No.: 12/247,940

(22) Filed: Oct. 8, 2008

(65) Prior Publication Data
US 2010/0085046 A1    Apr. 8, 2010

(51) Int. Cl.
*G01V 3/00* (2006.01)
(52) U.S. Cl. ...................... 324/307; 324/309
(58) Field of Classification Search ............... 324/307, 324/309
See application file for complete search history.

(56) References Cited

U.S. PATENT DOCUMENTS

| | | | |
|---|---|---|---|
| 4,999,580 A | 3/1991 | Meyer et al. | |
| 6,028,428 A | 2/2000 | Cunningham et al. | |
| 6,275,040 B1 * | 8/2001 | Zur | 324/320 |
| 6,304,084 B1 * | 10/2001 | Star-Lack et al. | 324/307 |
| 7,042,214 B2 | 5/2006 | Cunningham et al. | |
| 2008/0116893 A1 * | 5/2008 | Petersson et al. | 324/318 |
| 2008/0169809 A1 * | 7/2008 | Petersson et al. | 324/309 |

OTHER PUBLICATIONS

Larson et al., "Multiband excitation pulses for hyperpolarized 13C dynamic chemical-shift imaging," Journal of Magnetic Resonance, Jun. 24, 2008.

* cited by examiner

*Primary Examiner*—Louis M Arana
(74) *Attorney, Agent, or Firm*—Beyer Law Group LLP

(57) ABSTRACT

A method for performing magnetic resonance spectroscopy is described. The method generally includes applying a tailored multiband spectral-spatial radio frequency excitation pulse to a sample including a first species and at least a second species having a different resonant frequency than the first species. The multiband excitation pulse excites the first species according to a first amplitude and excites the second species according to a second amplitude that is substantially greater than the first amplitude. Data is acquired from the sample. The acquired data is then utilized to generate a spectroscopic output. By way of example, the spectroscopic output is a spectroscopic image. In particular embodiments, the data for the first and second species is acquired dynamically over an observation window of time.

19 Claims, 10 Drawing Sheets

HYPERPOLARIZED DYNAMIC CHEMICAL SHIFT IMAGING WITH TAILORED MULTIBAND EXCITATION PULSES

GOVERNMENT RIGHTS

The U.S. government has rights in the disclosed invention pursuant to National Institutes of Health (NIH) grants to Stanford University including R01 EB007588 and R01 CA111291.

FIELD OF THE INVENTION

The present invention relates generally to magnetic resonance imaging (MRI). More particularly, the present invention relates to MRI using tailored multiband excitation pulses.

BACKGROUND

Magnetic resonance imaging (MRI) is a non-destructive method for the analysis of materials and represents a relatively new approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body. More specifically, nuclear spins can be viewed as vectors in a three-dimensional space. During an MRI process, each nuclear spin responds to four different effects—precession about the main magnetic field, nutation about an axis perpendicular to the main field, and both transverse and longitudinal relaxation. In steady-state MRI processes, a combination of these effects occurs periodically.

It would be desirable to have a method for spectrally selective imaging of different resonances that is specifically designed to both preserve hyperpolarized magnetization in a substrate while providing higher signal-to-noise-ratio (SNR) signals of metabolic products of the substrate.

SUMMARY OF THE DESCRIBED EMBODIMENTS

In accordance with the invention, a method for performing magnetic resonance spectroscopy is described. The method generally includes applying a tailored multiband spectral-spatial radio frequency excitation pulse to a sample including a first species and at least a second species having a different resonant frequency than the first species. According to various embodiments, the multiband excitation pulse excites the first species according to a first amplitude and excites the second species according to a second amplitude that is substantially greater than the first amplitude. Data is acquired from the sample. The acquired data is then utilized to generate a spectroscopic output. By way of example, in a particular embodiment, the spectroscopic output is a spectroscopic image of the sample. In particular embodiments, the data for the first and second species is acquired dynamically over an observation window of time. By way of example, the first species may be a hyperpolarized substrate that is injected into the sample such that the method is performed in vivo. In such embodiments, the second species may be a metabolic byproduct of the first species.

In various embodiments, the quantity of the first species in the sample is substantially greater than the quantity of the second species in the sample at least when the multiband excitation pulse is applied to the sample. Thus, in an example embodiment, the flip angle associated with the first species after the multiband excitation pulse is applied is substantially smaller than the flip angle associated with the second species after the multiband excitation pulse is applied. Furthermore, the method may generally include modifying the flip angles associated with the first and at least the second species to optimize a tradeoff between SNR, observable time and the disruption of metabolite kinetics. In one example embodiment, the resultant flip angle associated with the second species is a Shinnar-Le Roux based spectral-spatial design. Additionally, in many embodiments, the sample further includes at least a third species. The multiband excitation pulse may excite the third species according to a third amplitude that is substantially greater than the first amplitude. In an alternate embodiment, the multiband excitation pulse may be configured to not excite the third or a fourth species.

In various embodiments, the method further includes applying a spectral-spatial gradient to the sample. In a particular embodiment, the method includes using a flyback echo-planar gradient to encode spectral and spatial information related to the first species and the second species. The method may also include applying at least one refocusing pulse after applying the multiband excitation pulse. In a particular embodiment, two hyperbolic secant adiabatic refocusing pulses are applied after applying the multiband excitation pulse. In various embodiments, the method may further include correcting chemical-shift misregistration. The method may also be modified for three dimensional magnetic resonance spectroscopic imaging by adding a second phase encode direction.

In another aspect of the invention an apparatus that includes a magnet system and a controller electrically connected to the magnet system. The controller further includes a display, at least one processor and computer readable media. The computer readable media includes computer readable code executable by the at least one processor for applying a tailored multiband spectral-spatial radio frequency excitation pulse to a sample including a first species and at least a second species having a different resonant frequency than the first species, the multiband excitation pulse exciting the first species according to a first amplitude and exciting the second species according to a second amplitude that is substantially greater than the first amplitude. The computer code is further operable to acquire data from the sample and utilize the acquired data to generate a spectroscopic output.

The invention and objects and features thereof will be more readily apparent from the following detailed description and appended claims when taken in conjunction with the drawings.

DETAILED DESCRIPTION OF EXAMPLE EMBODIMENTS

Figure 1:
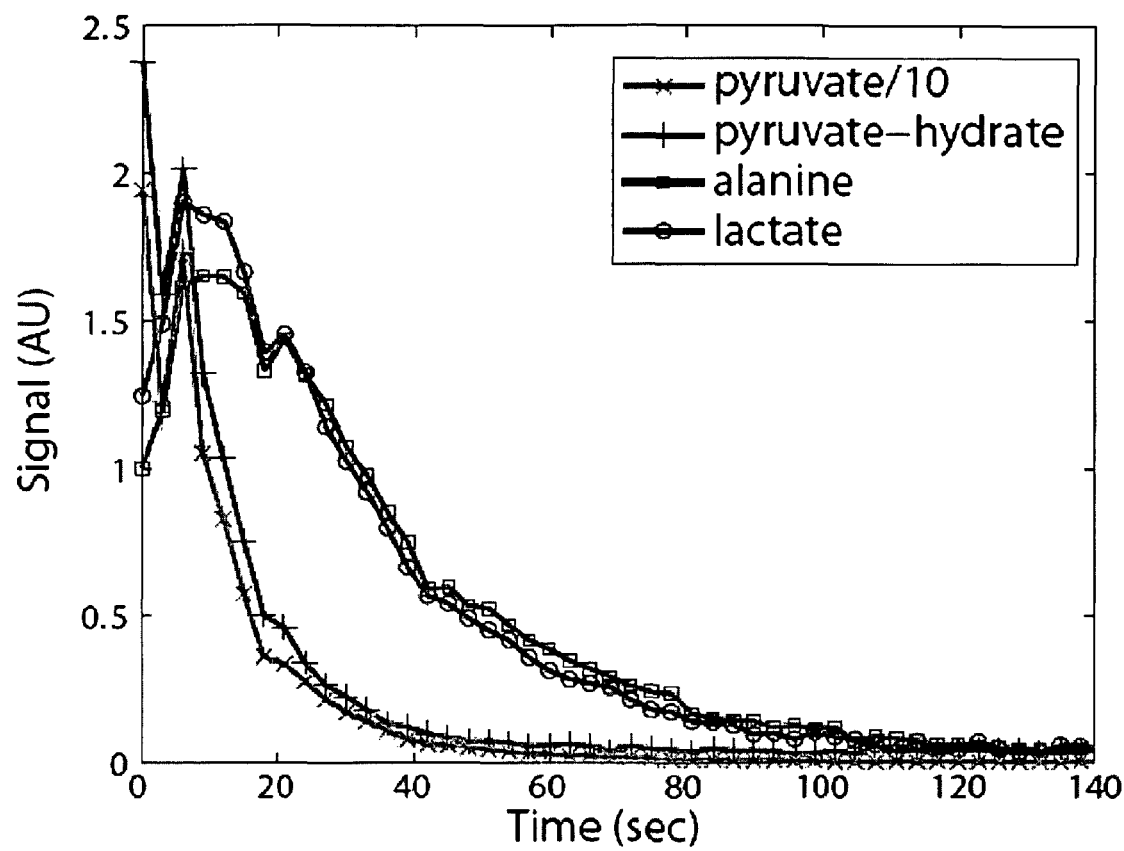
FIG. 1 shows example dynamic curves for a slab in a rat injected with hyperpolarized pyruvic acid.

Reference will now be made in detail to a particular embodiment of the invention, an example of which is illustrated in the accompanying drawings. While the invention will be described in conjunction with the particular embodiment, it will be understood that it is not intended to limit the invention to the described embodiment. To the contrary, it is intended to cover alternatives, modifications, and equivalents as may be included within the spirit and scope of the invention as defined by the appended claims.

Particular embodiments of the invention provide methods designed specifically for dynamic hyperpolarized magnetic resonance spectroscopic imaging (MRSI) to efficiently form and utilize an observable signal. Broadly, various embodiments utilize a lower flip angle (lower amplitude excitation) for a first species such as an injected hyperpolarized substrate and larger flip angles (higher amplitude excitations) for selected other species such as metabolic products of the substrate, which are generally present in lower quantities. This is achieved through multiband spectral-spatial radio frequency (RF) excitation pulses that are specifically designed to both preserve the hyperpolarized magnetization of the substrate while providing higher signal-to-noise-ratio (SNR) signals of selected metabolic products.

The use of hyperpolarized contrast agents for in vivo MRI spectroscopy has been made possible in part by the recent development in maintaining dynamic nuclear polarization (DNP) in solution. Hyperpolarization refers to the selective polarization of nuclear spin in atoms (e.g., $^{13}$C) far beyond normal thermal equilibrium. Contrast agents have been used in various MR applications to increase the sensitivity possible in imaging. The contrast agents used in MR are selected for their specific magnetic properties. The following disclosure focuses on embodiments that utilize $^{13}$C substrates (e.g., $^{13}$C-pyruvate) as contrast agents, however, in other embodiments other suitable contrast agents, such as $^{15}$N for example, may be used and are within the scope of the present invention. $^{13}$C is a stable isotope of carbon that makes up approximately 1% of all natural carbon on earth. Certain molecules such as proteins utilized in MR applications can be deliberately labeled with $^{13}$C to facilitate MR imaging and spectroscopy.

Hyperpolarized $^{13}$C MR spectroscopy is an exceptionally interesting and relatively new method because it allows for real-time metabolic imaging of normal and disease processes in vivo. These experiments are generally characterized by injection of a hyperpolarized substrate that produces metabolic products when metabolized within the body, all of which can be observed using spectroscopic techniques. The presence and quantity of certain metabolic products can provide information about tissues of interest in addition to their structure. Hyperpolarized $^{13}$C-pyruvate is one of the most promising substrates because it is converted enzymatically in vivo to $^{13}$C-lactate, $^{13}$C-alanine, and $^{13}$C-bicarbonate. MRSI, also known as chemical shift imaging (CSI), acquired dynamically is also desirable because it provides enhanced information about both spatial variation and temporal characteristics of the metabolic processes.

One characteristic feature of hyperpolarized imaging is that there is generally substantially more magnetization in the hyperpolarized substrate than any other compounds, and particularly the metabolic products. By way of example, FIG. 1 illustrates non-localized dynamic curves obtained for a slab in a rat injected with hyperpolarized pyruvate. The acquisition used a 5 cm slab, a 5° flip angle and a repetition time (TR) of 3 s. As those of skill in the art will appreciate, the amplitude of excitation is proportional to the flip angle. The injected $^{13}$C-pyruvate substrate signal is scaled down by a factor of 10 relative to the associated pyruvate-hydrate, alanine and lactate signals of the metabolic products. As is evident from FIG. 1, the injected substrate contains the majority of the signal while the metabolic products are approximately an order of magnitude smaller. To observe the compounds with lower concentrations, including the metabolic products alanine and lactate, higher RF pulse flip angles are generally required for adequate SNR. The higher flip angles will, in turn, destroy a larger percentage of the magnetization, particularly in the substrate. This ultimately results in less magnetization in the metabolic products at later time points. When using hyperpolarized contrast agents, the majority of the magnetization cannot be recovered once it decays to its thermal equilibrium level. This typically results in a maximum imaging window of approximately 1-2 min for a $^{13}$C-pyruvate substrate and its products as a result of T1 decay. Furthermore, each applied RF excitation pulse uses up some of the magnetization of the hyperpolarized substrate. This is particularly a problem for dynamic CSI, which requires multiple excitations and has less SNR because of the spatial resolution.

This disclosure presents methods that account for the disparity in magnetization between compounds and compensates to preserve substrate magnetization while providing sufficient SNR for imaging selected metabolic products. Particular embodiments of the invention utilize tailored multiband RF excitation pulses with spectrally varying flip angles to provide a balance between SNR, temporal window, and magnetization consumption for MRSI and magnetic resonance spectroscopy. More specifically, the excitation flip angle is varied across the compounds (e.g., the substrate and its metabolic products in particular) in order to best utilize the magnetization for the compounds of interest, while not wasting magnetization on compounds of no interest. The flexibility in the pulse design allows for adjustments of these tradeoffs. Various embodiments of the method include a convex optimization design for the spectral filter to efficiently match the desired variable flip angle across the frequency response. In the described embodiments, the frequency response is allowed to alias on itself, adding more flexibility to the design. Various embodiments also correct for chemical shift misregistration of the slice and include a Shinnar-Le Roux based design for larger flip angles (such as, for example, various metabolic products of the substrate).

In various embodiments, the RF excitation pulses are designed to lengthen the imaging window (by preserving the magnetization in the substrate) and, in particular embodiments, enable better observation of the metabolic products. While the described embodiments utilize a $^{13}C$-pyruvate substrate, it will be appreciated that other suitable substrates may be used as well with suitable modifications. Broadly, small excitation flip angles are used for the substrate to reduce the loss of magnetization while larger tailored flip angles are used for the metabolic products such that a higher SNR is achieved for dynamic CSI. By way of example, an SNR increase of over 10,000 compared to thermal equilibrium values has been demonstrated using $^{13}C$-hyperpolarized contrast agents.

Figure 2C:
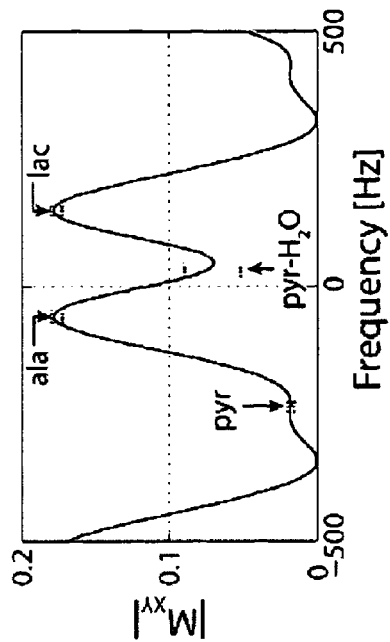
FIG. 2C shows the spectral profile obtained using the example multiband RF excitation pulse of FIG. 2A.
Figure 2D:
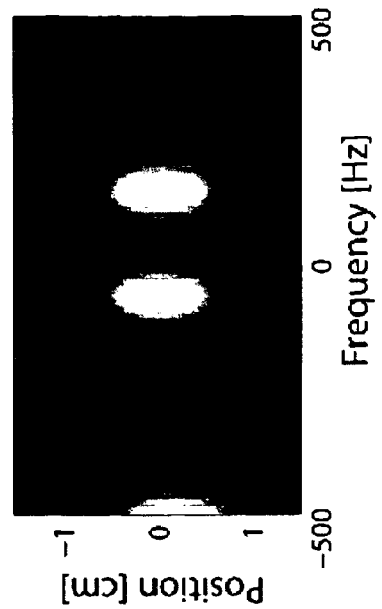
FIG. 2D shows the spectral-spatial profile obtained using the example multiband RF excitation pulse of FIG. 2A.
Figure 2A:
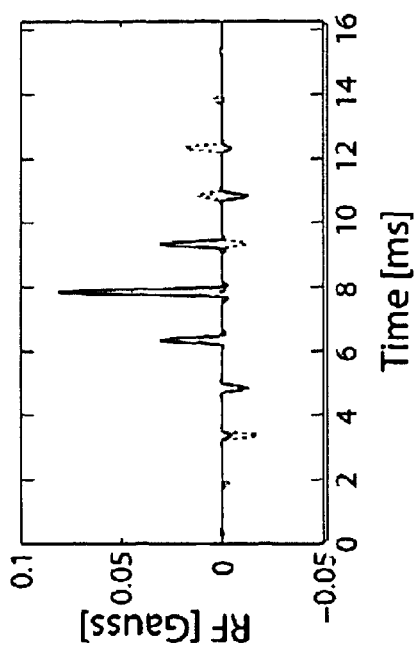
FIG. 2A shows an example multiband RF excitation pulse used for hyperpolarized $^{13}$C-pyruvate rat experiments at 3T in accordance with an embodiment of the present invention.
Figure 2B:
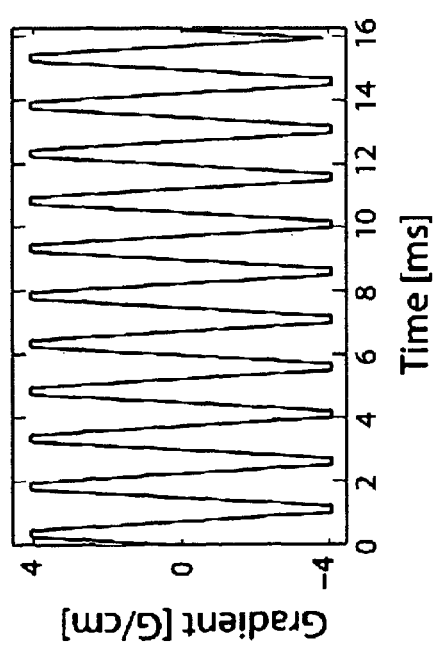
FIG. 2B shows the accompanying gradient used for the example multiband RF excitation pulse of FIG. 2A.

FIG. 2A illustrates an example embodiment of a multiband RF excitation pulse used for hyperpolarized $^{13}C_1$-pyruvate rat experiments at 3T. The real component of the RF pulse is shown with a sold line while the imaginary component is illustrated with a dashed line. A flyback gradient was used and the slice had a thickness of 15 mm. FIG. 2B shows the accompanying gradient. The response was specified around the pyruvate, lactate, alanine and pyruvate-hydrate resonances, shown by the dashed lines in FIG. 2C. The pulse was designed such that the pyruvate was excited for a 1° flip angle with a 0.1% ripple so the majority of the hyperpolarization was preserved. Lactate and alanine were excited for a 10° flip angle and 1% ripple to provide sufficient SNR for observation. The pyruvate-hydrate flip-angle was minimized as saturation of the hydrate magnetization would also saturate the pyruvate magnetization through the exchange. A 4° pyruvate-hydrate flip angle with 10% ripple was achieved. FIG. 2C shows the spectral profile with specified bands (in dashed lines) for pyruvate (pyr) with a 1° flip angle, alanine (ala) with a 10° flip angle, lactate (lac) with a 10° flip angle, and pyruvate-hydrate (pyr-H2O) with a 4° flip angle. Notably, there is no chemical shift slice misregistration, as seen by the identical spatial extent across the frequency range of interest in FIG. 2D, which illustrates the spectral and spatial profile.

Figure 3A:
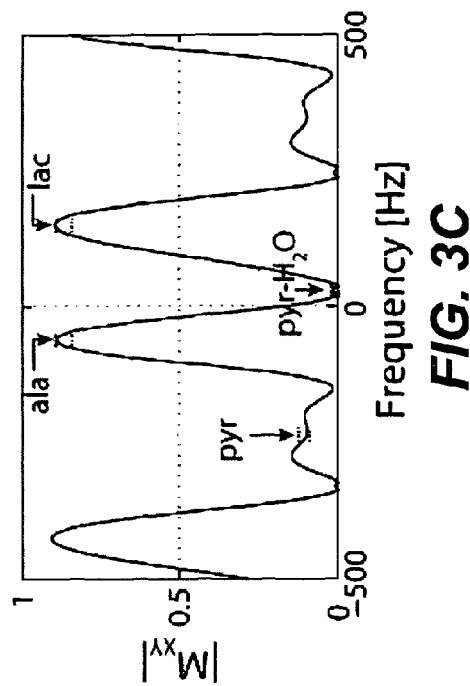
FIG. 3A shows another example multiband RF excitation pulse used for hyperpolarized $^{13}$C-pyruvate mouse experiments in accordance with an embodiment of the present invention
Figure 3C:
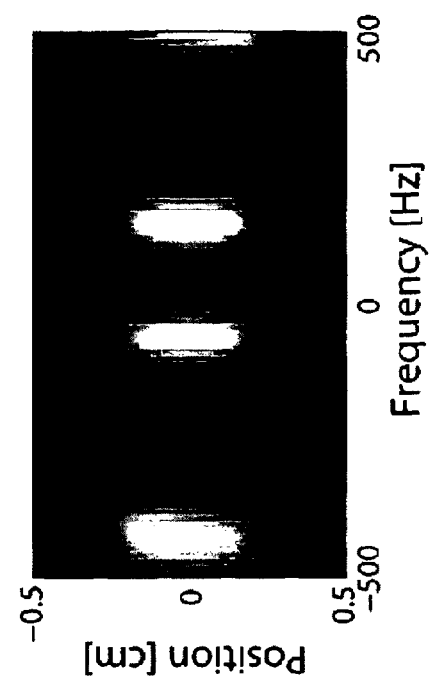
FIG. 3C shows the spectral profile obtained using the example multiband RF excitation pulse of FIG. 3A.
Figure 3B:
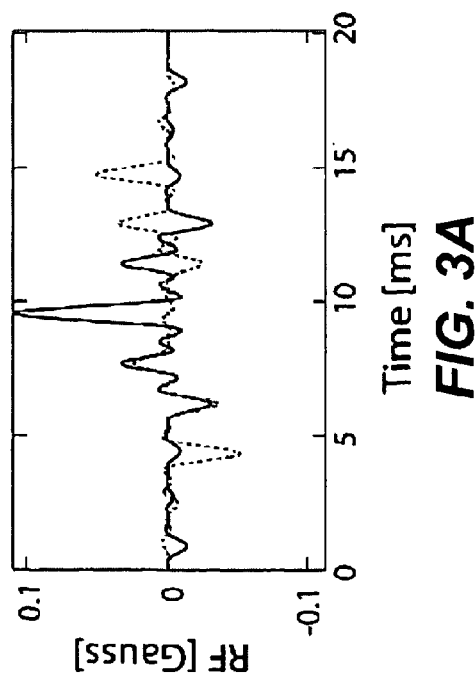
FIG. 3B shows the accompanying gradient used for the example multiband RF excitation pulse of FIG. 3A.
Figure 3D:
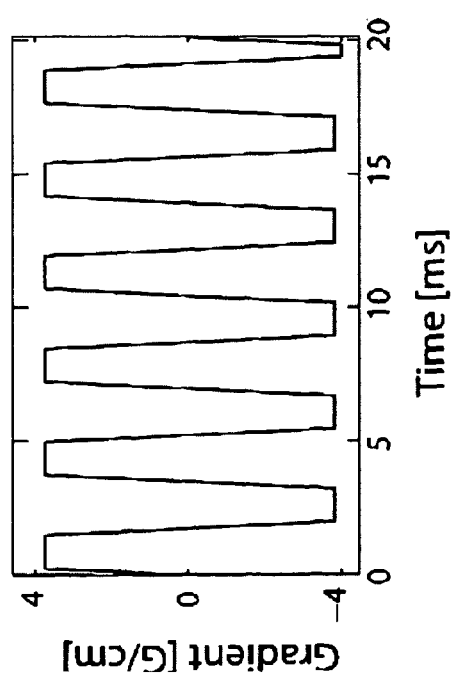
FIG. 3D shows the spectral-spatial profile obtained using the example multiband RF excitation pulse of FIG. 3A.

FIG. 3A illustrates another example embodiment of a multiband RF excitation pulse used for mouse experiments in which an echo-planar gradient was used. In this example, no pyruvate-hydrate was excited. The real component of the RF pulse is shown with a solid line while the imaginary component is illustrated with a dashed line. The slice had a thickness of 5 mm. FIG. 3B illustrates the accompanying gradient. This pulse was designed for larger flip angles around the lactate and alanine resonances, allowing for a sufficiently large SNR to observe these peaks with a 5 mm slice. A small flip angle was designed for at the pyruvate resonance to reduce the loss of polarization due to the repeated RF excitations required. The private-hydrate flip angle was set to zero both because it is not necessary to observe in this experiment as well as to preserve the pyruvate magnetization. FIG. 3C shows the spectral profile with specified bands (in dashed lines) for pyruvate (pyr) with a 6° flip angle, alanine (ala) with a 60° flip angle, lactate (lac) with a 60° flip angle, and pyruvate-hydrate (pyr-H2O) with a 0° flip angle. Again, there is no chemical shift misregistration. The dashed lines in FIG. 3C represent the specified frequency bands. FIG. 3D illustrates the spectral and spatial profile.

The two example embodiments of pulse designs just described demonstrate the flexibility in the disclosed multiband RF excitation pulse design method. The varying desired spectral responses are precisely matched with minimal energy outside of the bands. Both echo-planar and flyback gradients were used in these embodiments. The desired slice profile and minimum thickness was also precise and, again, exhibited no chemical-shift slice misregistration.

Figure 4:
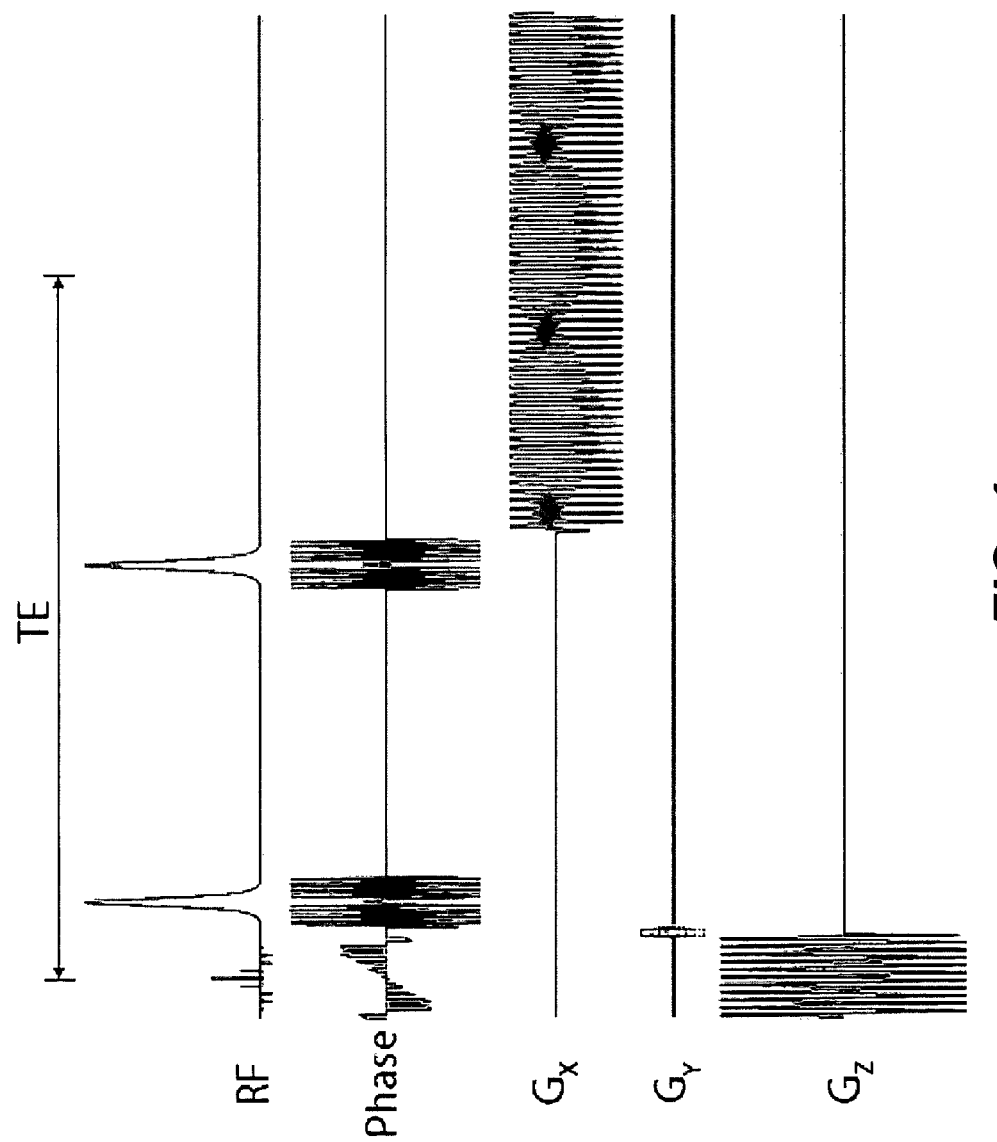
FIG. 4 shows an example pulse sequence used for dynamic spectral-spatial imaging in accordance with an embodiment of the present invention.

An example embodiment of a pulse sequence used for dynamic spectral-spatial imaging is shown in FIG. 4. In this embodiment, the multiband RF excitation pulses described in the previous section with reference to FIG. 2A and/or FIG. 3A are followed by two hyperbolic secant adiabatic refocusing pulses used to create a spin-echo. The pair of adiabatic pulses ensure that no magnetization is lost due to flip angle inaccuracies while forming a spin-echo. During the readout, a flyback echo-planar gradient was used to encode both spectral and spatial information. Furthermore, a full echo acquisition is used for improved SNR and to allow for magnitude spectral reconstructions. This sequence can be repeated to encode in other spatial dimensions, and all these encodings can be repeated to provide temporal data.

Figure 5:
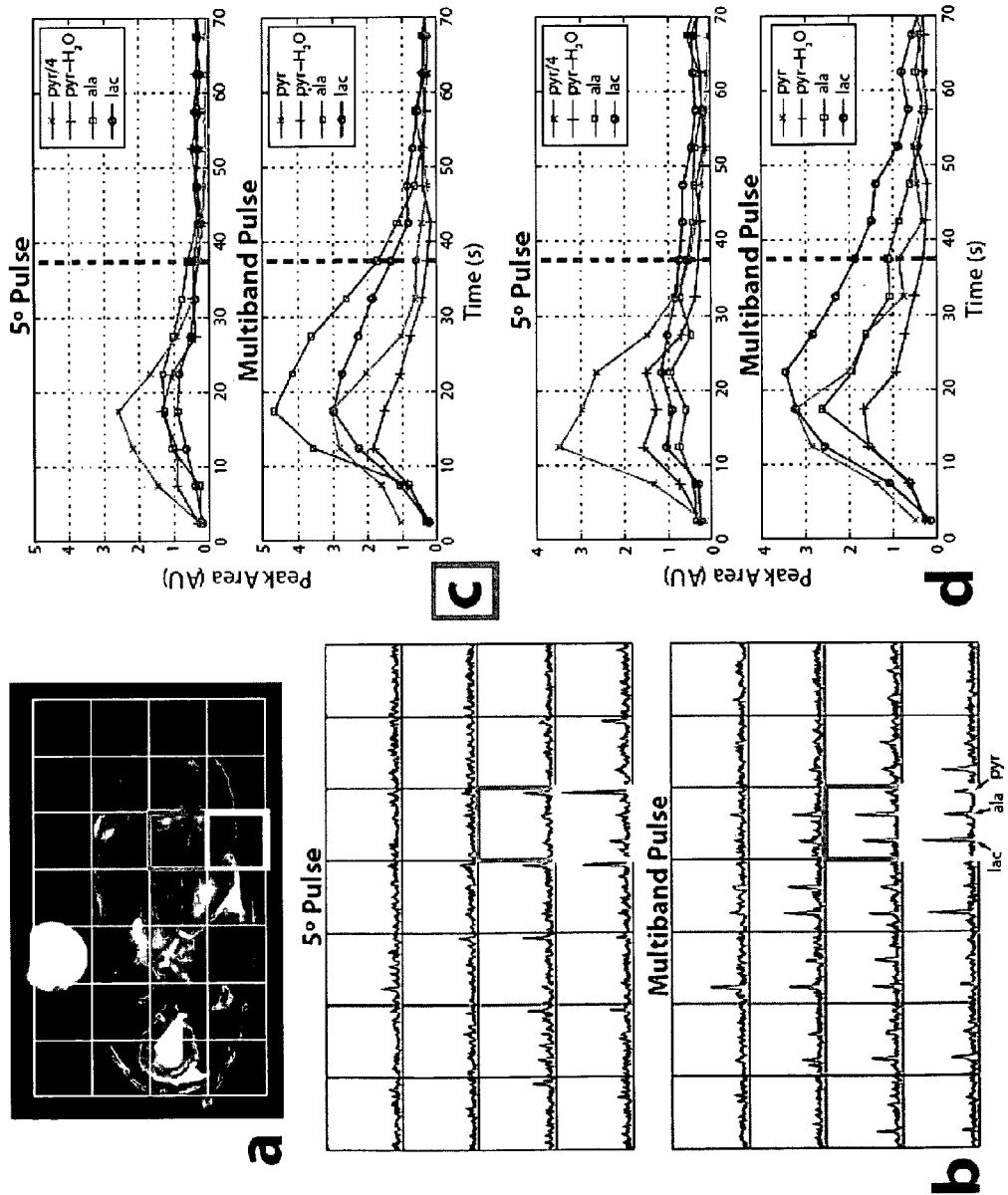
FIGS. 5A-5D show the results of an experiment in which a rat was imaged in vivo using the multiband excitation pulse shown in FIG. 2A as well as with a standard 5° flip angle standard RF excitation pulse.

In example experiments, both rats and mice were imaged with this dynamic 2D $^{13}C$ MRSI sequence to test and demonstrate the advantages of some particular embodiments. The dynamic in vivo rat imaging results are shown in FIGS. 5A-D and 6A-D, which compare 5° and 10° flip angle standard RF excitation pulses, respectively, to the multiband excitation pulse shown in FIGS. 2A and 2B. The resolution was 10 mm in-plane with a 15 mm slice thickness for 1.5 cc voxels, and images were acquired every 5 seconds starting at the beginning of injection. For each image, the multiband pulse has an expected loss of 11% of the magnetization for lactate and alanine, and a 0.12% loss for pyruvate. The 5° pulse has an expected loss of 3.0% for all compounds while the 10° pulse has an expected loss of 11% for all compounds. FIG. 5A shows the $T_2$-weighted fast spin-echo image showing the voxel locations. FIG. 5B illustrates spectra obtained from the eighth time point for both the standard and inventive multiband excitation pulses (37.5 s after injection, at the dashed line in FIGS. 5C and 5D). FIGS. 5C and 5D illustrate dynamic data from two voxels and show the increased lactate and alanine SNR. Note that in FIGS. 5C and 5D, the pyruvate signal has been scaled down by a factor of 4 for the 5° flip angle standard RF excitation pulses. In comparison to the 5° flip angle pulse (FIGS. 5A-D), the example multiband pulse of the present invention shows substantial increases in SNR and signal duration for lactate and alanine throughout the slice. The pyruvate-hydrate signal is similar between the experiments, as expected. The measured polarizations were similar and were 18.3% and 18.9% for the standard 5° flip angle and multiband pulse sequences, respectively.

Figure 6:
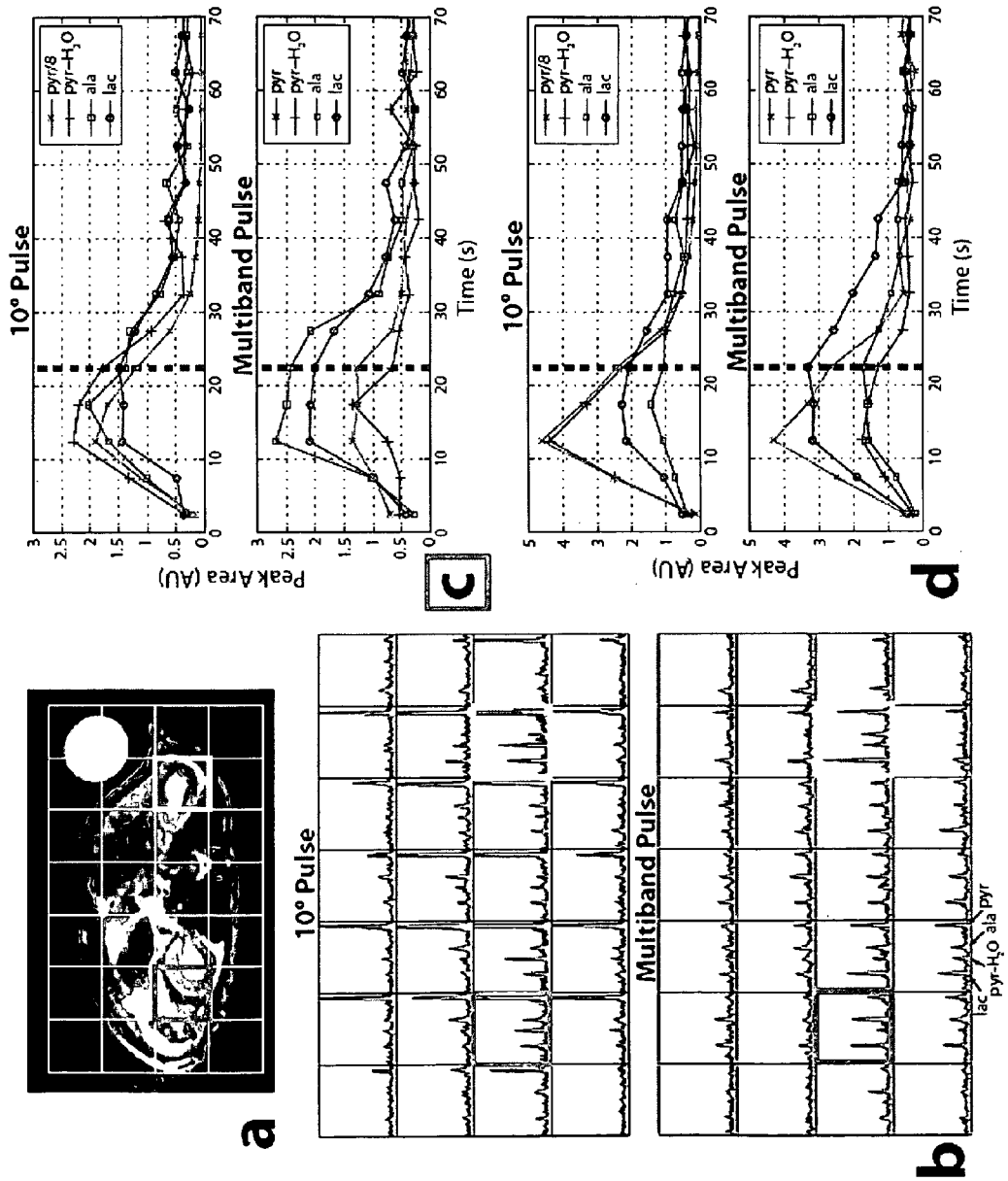
FIGS. 6A-6D show the results of an experiment in which a rat was imaged in vivo using the multiband excitation pulse shown in FIG. 2A as well as with a standard 10° flip angle standard RF excitation pulse.

Similarly, FIG. 6A shows the $T_2$-weighted fast spin-echo image showing the voxel locations for the comparison between the 10° flip angle standard RF excitation pulse and the inventive multiband pulse. FIG. 6B illustrates spectra from the fifth time point for both the 10° flip angle standard RF excitation pulse and inventive multiband pulse (22.5 s after injection, at the dashed line in FIGS. 6C and 6D). FIGS. 6C and 6D illustrate dynamic data from two voxels. Note that in FIGS. 6C and 6D, the pyruvate signal has been scaled down by a factor of 8 for the 10° flip angle standard RF excitation pulse. Notably, the spectra in FIG. 6B show generally increased SNR for lactate and alanine with the example multiband pulse of the present invention, which is particularly evident in the highlighted and posterior voxels. The measured polarization was 21.8% for the 10° flip angle pulse, higher than the 19.6% for the multiband pulse. Pyruvate and pyruvate-hydrate SNR was reduced with the multiband pulse, as expected. The change in SNR is also shown in the dynamic curves in FIGS. 6C and 6D. The lactate and alanine SNR was increased when the pyruvate flip angle is smaller, presumably because more hyperpolarized $^{13}$C pyruvate signal was retained throughout the repetitive pulsing. The time course of the metabolites also was observed to be generally lengthened, which is particularly noticeable for lactate in FIG. 6D.

Figure 7:
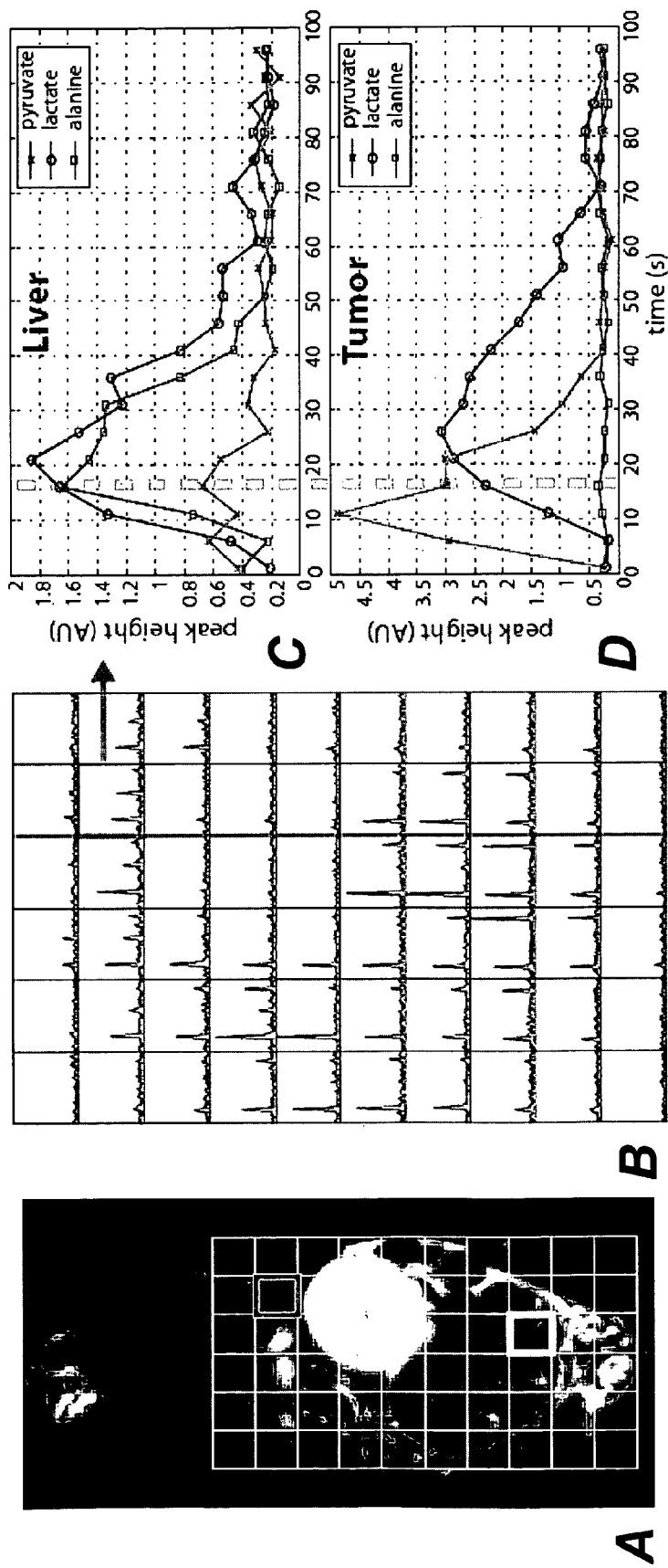
FIGS. 7A-7D shows the results of an experiment using the pulse of FIG. 3A.

A transgenic adenocarcinoma of mouse prostate (TRAMP) mouse with an advanced tumor was imaged using the echoplanar pulse of FIGS. 3A-D with a 5 mm slice thickness and 5×5.4 mm in-plane resolution for 0.135 cc voxels. Images were acquired every 5s from the start of injection of the $^{13}$C pyruvate substrate, and the results are shown in FIGS. 7A-7D, which has a polarization of 17.8%. In particular, FIG. 7A shows a $T_2$-weighted fast spin-echo image. FIG. 7B shows voxel spectra for 0.135 voxels for the multiband excitation pulse from FIGS. 3A-3D acquired 20 s after injection (dashed line in FIGS. 7C and 7D). FIGS. 7C and 7D show time series plots of the liver and tumor. The slice had a 16×8 matrix encoding which is 86.4×40 mm, only a section of which is shown. A variable flip angle scheme in accordance with an example embodiment of the invention was used for each image to minimize blurring. A variable flip angle was also used across images to increase the amount of lactate and alanine magnetization in later images. This resulted in an initial flip angle of 4.5° for lactate and alanine, where 2.5% of the magnetization was used per image. This progressed to 7° at 60 s (6.5% magnetization used) and 12° at 85 s after injection (16.2% magnetization used per image). The initial pyruvate flip angle was 0.5°, using only 0.03% of the magnetization, and progressed to 0.6° 40 s after injection (0.04% used) when pyruvate was last observed. Substantial lactate $^{13}$C signal was detected in the tumor with a lengthened time course, which is consistent with previous results. The alanine in the liver can also be observed by this slice.

Figure 8:
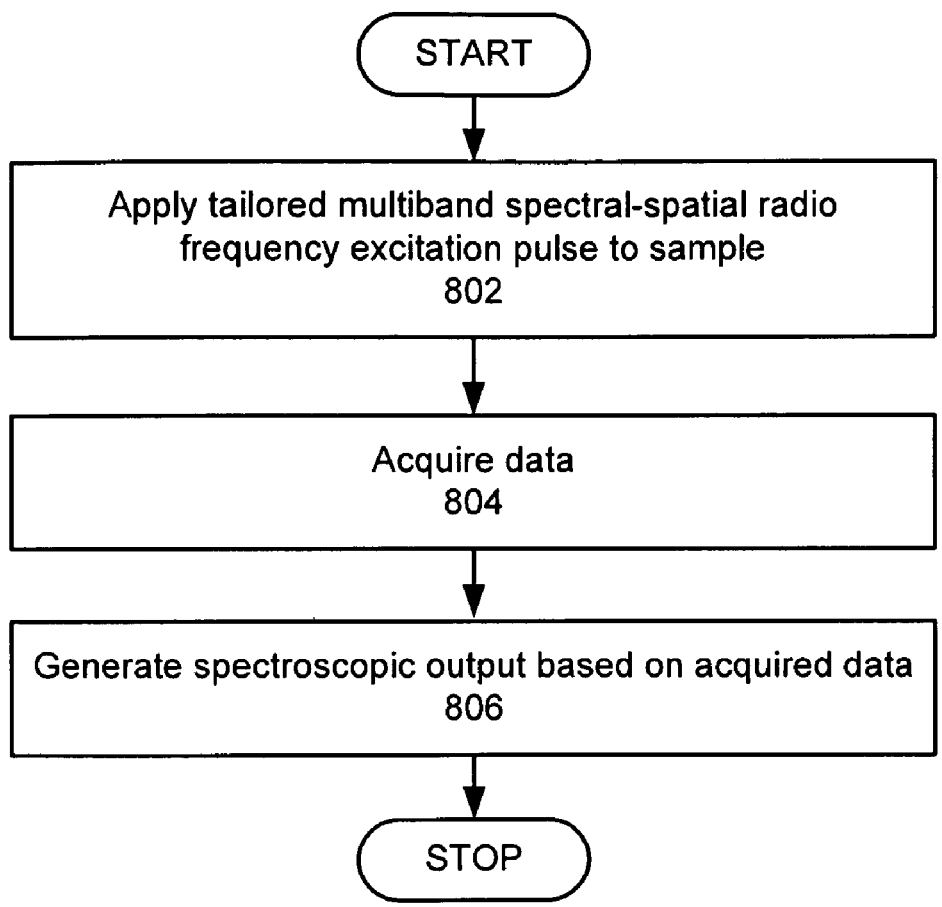
FIG. 8 is a high level flow chart of an embodiment of the invention.

FIG. 8 is a high level flow chart outlining a process 800 for performing magnetic resonance spectroscopy in accordance with a general embodiment of the invention. Process 800 begins at 802 with applying a tailored multiband spectral-spatial radio frequency excitation pulse to a sample. The sample includes a first species and at least a second species having a different resonant frequency than the first species (It should be noted that embodiments of the invention are also applicable in exciting 3, 4, 5 and even more selected species while intentionally not exciting certain frequency bands). By way of example, the first species may be a hyperpolarized substrate such as $^{13}$C-pyruvate described above having a first resonant frequency, while the second (and subsequent) species may be a metabolic product, such as alanine or lactate having a second resonant frequency. The multiband excitation pulse excites the first species at the first resonant frequency according to a first amplitude and excites the second species at the second resonant frequency according to a second amplitude that is substantially greater than the first amplitude. In some embodiments, it may also be desirable to intentionally not excite a certain resonance or frequency band related to a selected species, such as a third species (e.g., the pyruvate-hydrate described above with reference to FIGS. 6A-6D). Data is acquired from the sample at 804. The acquired data is then used to generate a spectroscopic output at 806. By way of example, the spectroscopic output may be a spectroscopic image, a spectroscopic profile or any other spectroscopic result such as any of those described earlier with reference to the Figures.

Embodiments of the invention, through the use of tailored multiband excitation pulses, allow for control of the tradeoff between SNR and hyperpolarized magnetization preservation for individual compounds. Previous dynamic CSI studies with hyperpolarized $^{13}$C have used constant amplitude excitation pulses that have no spectral selectivity. As shown in FIGS. 5A-D and FIGS. 6A-D, embodiments of the present invention are superior in providing a longer window to observe the metabolic products. Furthermore, they minimally perturb the hyperpolarized substrate with enough SNR to observe both the substrate and products.

One lactate-specific imaging method (Cunningham et al, Journal of Magnetic Resonance, Volume 193, Issue 1, July 2008, Pages 139-146) also uses spectral selectivity to enhance dynamic hyperpolarized $^{13}$C imaging. However, only lactate is excited by a spectral-spatial RF pulse, which is followed by imaging gradients. This lactate-specific imaging method is not spectroscopic and does not provide any spectral information, such as the alanine or pyruvate amplitudes, which is one particular advantage of various embodiments of the present invention.

It should be noted that several variations are possible in alternate embodiments. One variation is the adjustment of the flip angles for various compounds depending on the application. The reasons for this adjustment include different metabolism rates, kinetic modeling which requires more pyruvate SNR, and observation of a subset of compounds. Another variation presented is the use the majority of the magnetization. A further variation not shown would be to vary the flip angle across the different images to maximize the overall SNR. For example, the flip angle could be increased over time to improve the SNR when there is less magnetization available.

Various embodiments also include applications in which other substrates different from $^{13}$C substrates are used. These alternate substrates, and their metabolic products, will generally warrant different RF pulse designs. Other hyperpolarized nuclei may also benefit from this technique. The multiband pulses could also just be spectral pulses too in that no slice selection is necessary.

The spatial encoding of the image can also vary, and is easily extended to a 3D (three dimensional) acquisition. By way of example, a second phase encode direction may be added to enable 3D imaging. A compressed sensing acquisition scheme could also be used. For that matter, no spatial encoding could also be used for slice of non-selective dynamics.

Figure 9:
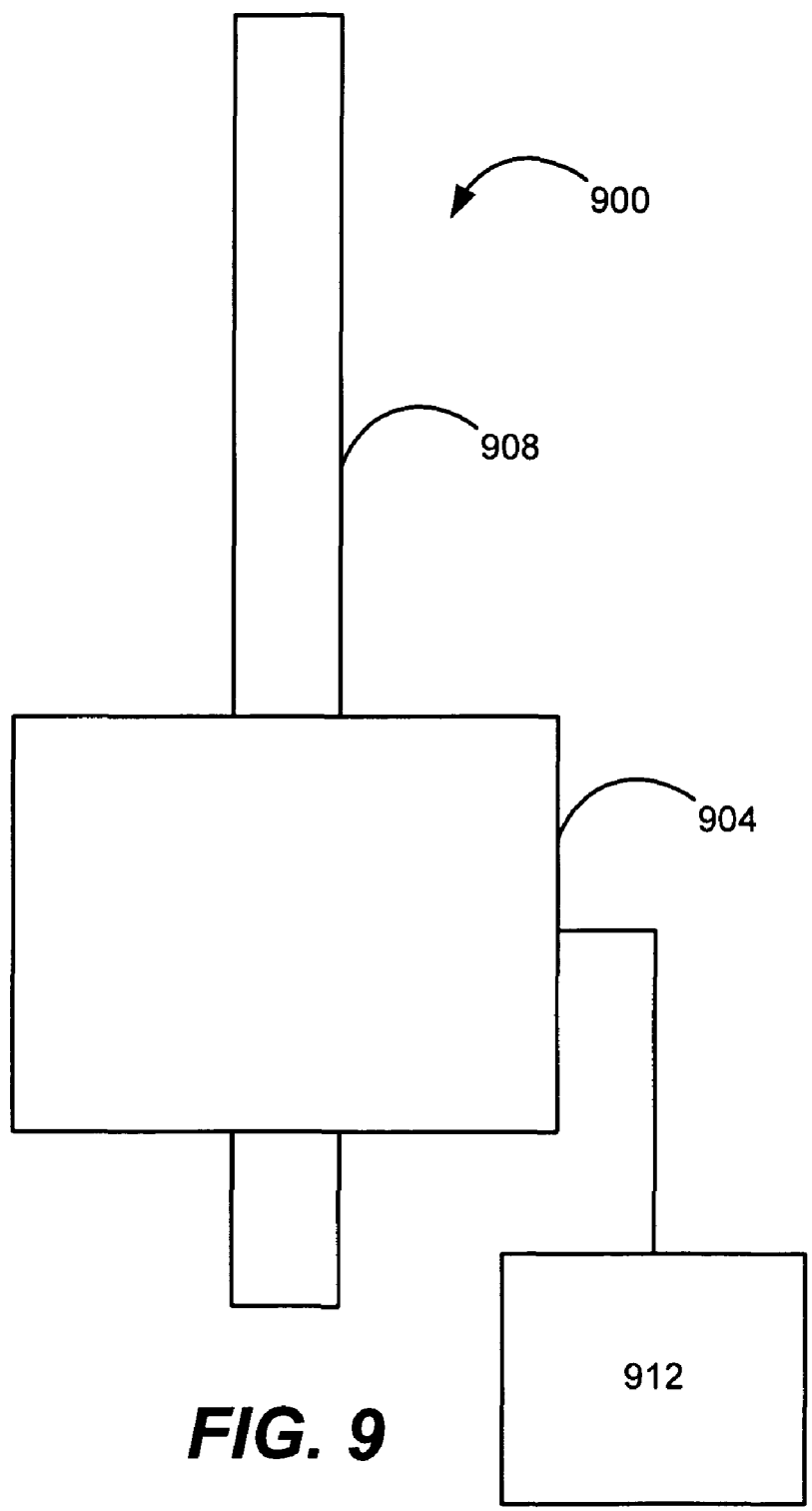
FIG. 9 is a schematic top view of a magnetic resonance imaging (MRI) system that may be used in an embodiment of the invention.

FIG. 9 is a schematic top view of a magnetic resonance imaging (MRI) system 900 that may be used in an embodiment of the invention. The MRI system 900 comprises a magnet system 904, a patient transport table 908 connected to the magnet system, and a controller 912 controllably connected to the magnet system. In one example, a patient would lie on the patient transport table 908 and the magnet system 904 would pass around the patient. The controller 912 would control magnetic fields and radio frequency (RF) signals provided by the magnet system 904 and would receive signals from detectors in the magnet system 904.

Figure 10A:
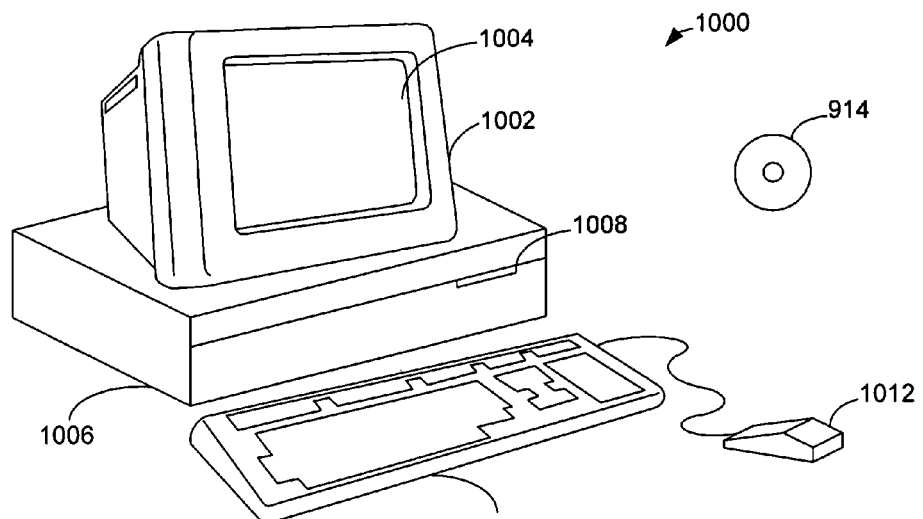
FIGS. 10A and 10B illustrate a computer system that may be used in an embodiment of the invention.
Figure 10B:
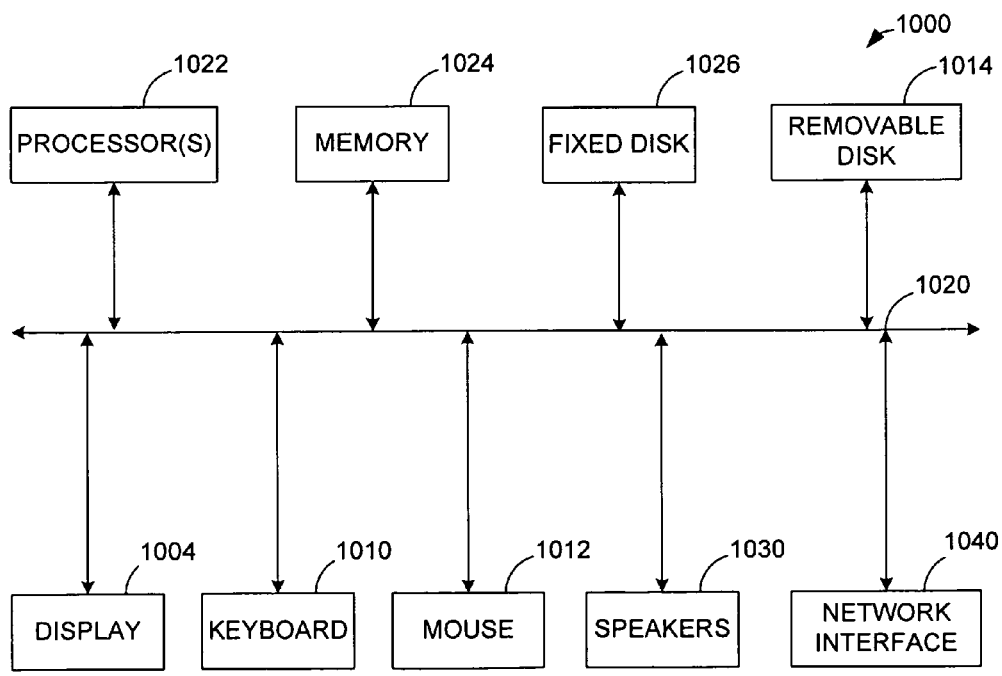

FIGS. 10A and 10B illustrate a computer system 1000, which is suitable for implementing a controller 1012 used in embodiments of the present invention. FIG. 10A shows one possible physical form of the computer system. Of course, the computer system may have many physical forms ranging from an integrated circuit, a printed circuit board, and a small handheld device up to a huge super computer. Computer system 1000 includes a monitor 1002, a display 1004, a housing 1006, a disk drive 1008, a keyboard 1010, and a mouse 1012. Disk 1014 is a computer-readable medium used to transfer data to and from computer system 1000.

FIG. 10B is an example of a block diagram for computer system 1000. Attached to system bus 1020 are a wide variety of subsystems. Processor(s) 1022 (also referred to as central processing units, or CPUs) are coupled to storage devices, including memory 1024. Memory 1024 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable kind of the computer-readable media described below. A fixed disk 1026 is also coupled bi-directionally to CPU 1022; it provides additional data storage capacity and may also include any of the computer-readable media described below. Fixed disk 1026 may be used to store programs, data, and the like and is typically a secondary storage medium (such as a hard disk) that is slower than primary storage. It will be appreciated that the information retained within fixed disk 1026 may, in appropriate cases, be incorporated in standard fashion as virtual memory in memory 1024. Removable disk 1014 may take the form of the computer-readable media described below.

CPU 1022 is also coupled to a variety of input/output devices, such as display 1004, keyboard 1010, mouse 1012, and speakers 1030. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1022 optionally may be coupled to another computer or telecommunications network using network interface 1040. With such a network interface, it is contemplated that the CPU might receive information from the network, or might output information to the network in the course of performing the above-described method steps. Furthermore, method embodiments of the present invention may execute solely upon CPU 1022 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The foregoing description, for purposes of explanation, used specific examples to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method for performing magnetic resonance spectroscopy, comprising:
   applying a tailored multiband spectral-spatial radio frequency excitation pulse to a sample including a first species and at least a second species having a different resonant frequency than the first species, the multiband excitation pulse exciting the first species according to a first amplitude and exciting the second species according to a second amplitude that is substantially greater than the first amplitude;
   acquiring data from the sample after applying the pulse;
   using the acquired data to generate a spectroscopic output.

2. The method as recited in claim 1, wherein the spectroscopic output is a spectroscopic image.

3. The method as recited in claim 2, wherein the quantity of the first species in the sample is substantially greater than the quantity of the second species in the sample at least when the multiband excitation pulse is applied to the sample.

4. The method as recited in claim 3, wherein the flip angle associated with the first species after the multiband excitation pulse is applied is substantially smaller than the flip angle associated with the second species after the multiband excitation pulse is applied.

5. The method as recited in claim 4, wherein the sample further includes at least a third species, the multiband excitation pulse exciting the third species according to a third amplitude that is substantially greater than the first amplitude.

6. The method as recited in claim 4, wherein the sample further includes at least a third species, the multiband excitation pulse being configured to not excite the third species.

7. The method as recited in claim 2, further comprising applying a spectral-spatial readout gradient to the sample.

8. The method as recited in claim 2, further comprising applying at least one refocusing pulse after applying the multiband excitation pulse.

9. The method as recited in claim 8, wherein two hyperbolic secant adiabatic refocusing pulses are applied after applying the multiband excitation pulse.

10. The method as recited in claim 2, further comprising using an echo-planar gradient to encode spectral and spatial information related to the first species and the second species.

11. The method as recited in claim 2, wherein the data for the first and second species is acquired dynamically over an observation window of time.

12. The method as recited in claim 11, wherein the first species is injected into the sample and wherein the method is performed in vivo.

13. The method as recited in claim 12, wherein the second species is a metabolic byproduct of the first species.

14. The method as recited in claim 11, wherein the first species is a $^{13}$C-based molecule.

15. The method as recited in claim 2, further comprising correcting chemical-shift misregistration.

16. The method as recited in claim 2, further comprising modifying for three dimensional magnetic resonance spectroscopic imaging by adding a second phase encode direction.

17. The method as recited in claim 2, wherein the resultant flip angle associated with the second species is a Shinnar-Le Roux based spectral-spatial design.

18. The method as recited in claim 2, further comprising modifying the flip angles associated with the first and at least the second species to optimize a tradeoff between SNR, observable time and the disruption of metabolite kinetics.

19. An apparatus, comprising:
a magnet system;
a controller electrically connected to the magnet system, comprising:
a display;
at least one processor; and
computer readable media, comprising:
computer readable code executable by the at least one processor for performing magnetic resonance spectroscopy, wherein the computer readable code is operable to:
apply a tailored multiband spectral-spatial radio frequency excitation pulse to a sample including a first species and at least a second species having a different resonant frequency than the first species, the multiband excitation pulse exciting the first species according to a first amplitude and exciting the second species according to a second amplitude that is substantially greater than the first amplitude;
acquire data from the sample after applying the pulse;
utilize the acquired data to generate a spectroscopic output.

* * * * *

UNITED STATES PATENT AND TRADEMARK OFFICE
CERTIFICATE OF CORRECTION

PATENT NO. : 7,795,868 B2  Page 1 of 1
APPLICATION NO. : 12/247940
DATED : September 14, 2010
INVENTOR(S) : Larson et al.

It is certified that error appears in the above-identified patent and that said Letters Patent is hereby corrected as shown below:

In the Specification Under Column 1:

Please replace Column 1, Line no. 7-10 with

--This invention was made with Government support under contracts CA111291, EB007588, RR009784 awarded by the National Institutes of Health. The Government has certain rights in this invention.--

Signed and Sealed this
Sixteenth Day of July, 2013

Teresa Stanek Rea
*Acting Director of the United States Patent and Trademark Office*